United States Patent
Kumakura et al.

(10) Patent No.: US 12,100,578 B2
(45) Date of Patent: Sep. 24, 2024

(54) SUBSTRATE PROCESSING METHOD

(71) Applicant: Tokyo Electron Limited, Tokyo (JP)

(72) Inventors: Sho Kumakura, Miyagi (JP); Yuta Nakane, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 44 days.

(21) Appl. No.: 17/557,045

(22) Filed: Dec. 21, 2021

(65) Prior Publication Data

US 2022/0199371 A1    Jun. 23, 2022

(30) Foreign Application Priority Data

Dec. 21, 2020  (JP) .................. 2020-211353

(51) Int. Cl.
| | |
|---|---|
| C23C 16/02 | (2006.01) |
| B05D 1/00 | (2006.01) |
| C23C 16/50 | (2006.01) |
| C23C 16/52 | (2006.01) |
| H01J 37/32 | (2006.01) |
| H01L 21/3065 | (2006.01) |

(52) U.S. Cl.
CPC .......... *H01J 37/32504* (2013.01); *B05D 1/62* (2013.01); *C23C 16/0272* (2013.01); *C23C 16/50* (2013.01); *C23C 16/52* (2013.01); *H01J 37/32972* (2013.01); *H01J 37/32082* (2013.01); *H01J 2237/332* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 6,164,295 A * | 12/2000 | Ui | B08B 7/0035 216/60 |
| 7,204,913 B1 | 4/2007 | Singh et al. | |
| 9,741,584 B1 * | 8/2017 | Park | H01J 37/321 |
| 2015/0104942 A1 * | 4/2015 | Sasaki | H01L 21/32139 438/695 |
| 2015/0147482 A1 * | 5/2015 | Kang | C23C 16/45525 427/535 |
| 2017/0263442 A1 * | 9/2017 | Kang | C23C 16/45527 |
| 2019/0218662 A1 * | 7/2019 | Itatani | C23C 16/34 |

FOREIGN PATENT DOCUMENTS

JP    2015-122486 A    7/2015

* cited by examiner

*Primary Examiner* — Shamim Ahmed
*Assistant Examiner* — Bradford M Gates
(74) *Attorney, Agent, or Firm* — XSENSUS LLP

(57) ABSTRACT

A substrate processing method includes forming a pre-coat film on an in-chamber part disposed in a chamber, and subsequently processing one or more substrates. The forming a pre-coat film includes forming a first film on the in-chamber part without using plasma or by using a first plasma generated under a condition that sputtering is suppressed on the in-chamber part, and forming a second film on a surface of the first film by using a second plasma.

14 Claims, 10 Drawing Sheets

SUBSTRATE PROCESSING METHOD

CROSS-REFERENCE TO RELATED APPLICATION

This application is based on and claims priority to Japanese Patent Application No. 2020-211353, filed on Dec. 21, 2020, with the Japan Patent Office, the disclosure of which is incorporated herein in its entirety by reference.

TECHNICAL FIELD

The present disclosure relates to a substrate processing method.

BACKGROUND

U.S. Pat. No. 7,204,913 discloses a method of coating a silicon-containing film on an inner wall of a chamber before a substrate processing to reduce particles.

SUMMARY

According to an aspect of the present disclosure, a substrate processing method includes forming a pre-coat film on an in-chamber part disposed in a chamber, and subsequently processing one or more substrates. The forming a pre-coat film includes forming a first film on the in-chamber part without using plasma or by using a first plasma generated under a condition that sputtering is suppressed on the in-chamber part, and forming a second film on a surface of the first film by using a second plasma.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In the manufacture of semiconductor devices, substrates such as semiconductor wafers are placed in a chamber and substrate processing such as plasma etching is performed. The inner wall of the chamber is covered with, for example, a metal compound such as Al (aluminum) or Y (yttrium). When the substrate processing is performed in the chamber, the metal compound covering the inner wall of the chamber may be peeled off, and thus shape abnormality may occur in the semiconductor device due to particles of the peeled metal compound. Therefore, before the substrate processing is performed, the inside of the chamber is pre-coated to suppress the contamination by the metal compound. The pre-coating is performed by generating plasma from a film-forming material supplied into the chamber. At this time, ions may enter parts in the chamber before the precoat film is formed, which turns out particles being generated.

Therefore, a new technique for pre-coating the inside of the chamber while suppressing the generation of particles is expected.

Embodiment (Configuration of Film Forming Apparatus)

Figure 1:
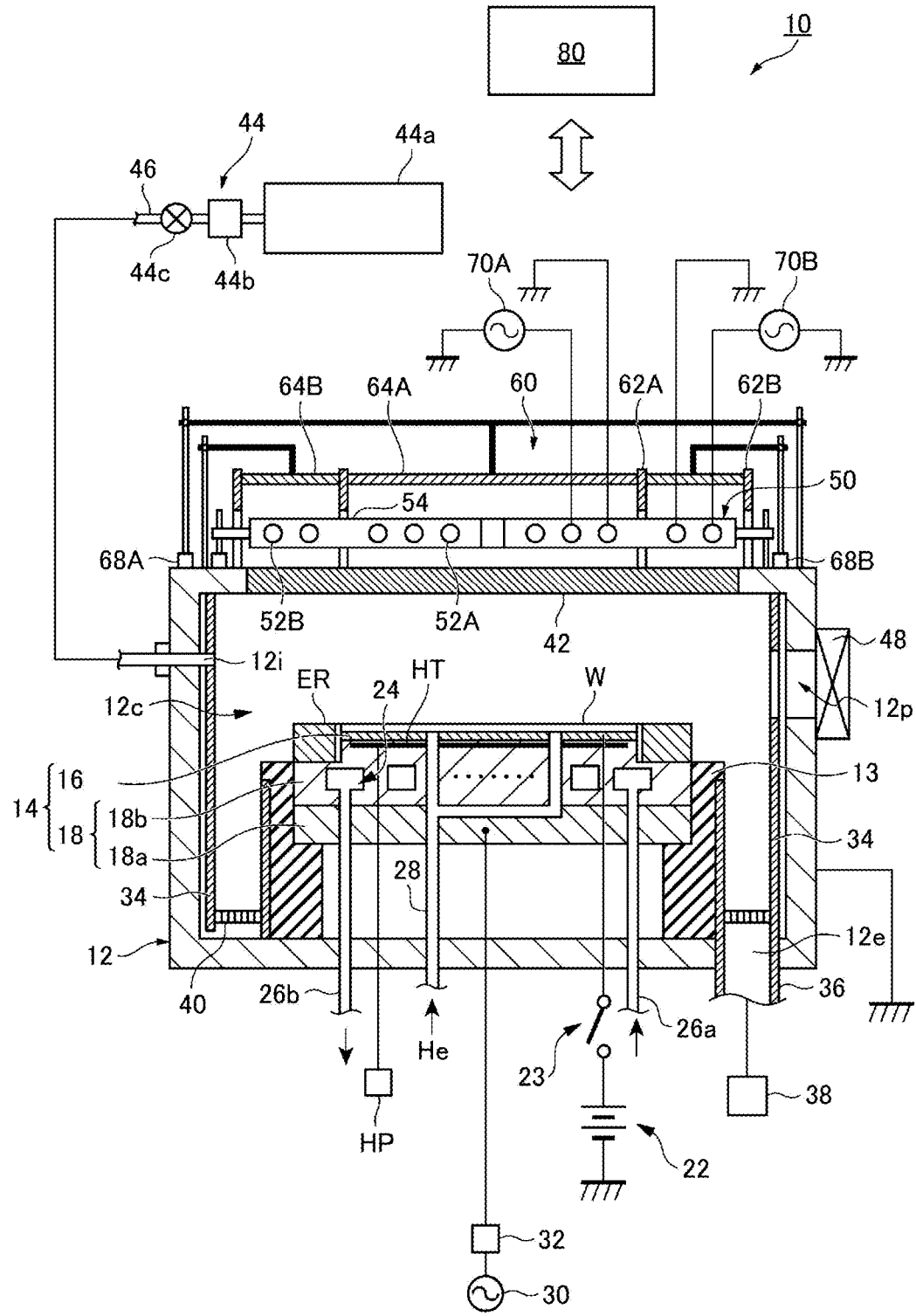
FIG. 1 is a diagram illustrating a schematic configuration of a substrate processing apparatus according to an embodiment.

Embodiments will be described. Hereinafter, a case where plasma processing such as plasma etching is performed as the substrate processing will be described as the main example. FIG. 1 is a diagram illustrating a schematic configuration of a substrate processing apparatus 10 according to an embodiment. The substrate processing apparatus 10 is an example of a substrate processing apparatus according to the embodiment. The substrate processing apparatus 10 illustrated in FIG. 1 can be used to implement a substrate processing method according to the embodiment. The substrate processing apparatus 10 illustrated in FIG. 1 is a so-called inductively-coupled plasma (ICP) apparatus, and includes a plasma source for generating inductively-coupled plasma. The substrate processing apparatus according to the embodiment may use plasma generated by another method. For example, the substrate processing apparatus according to the embodiment may be an apparatus using capacitively-coupled plasma (CCP), electron-cyclotron-resonance plasma (ECR plasma), helicon wave excitation plasma (HWP), surface wave plasma (SWP), or the like.

The substrate processing apparatus 10 includes a chamber 12. The chamber 12 is formed of metal containing Al (aluminum), Y (yttrium), or the like. For example, the chamber 12 is formed of $Al_2O_3$ or $Y_2O_3$. The chamber 12 has a substantially cylindrical shape, for example. A space 12c in which processing is to be performed is provided in the chamber 12.

A substrate support 14 is disposed below the space 12c. The substrate support 14 is configured to hold a substrate W placed on the substrate support 14. The substrate W is a semiconductor wafer, for example.

The substrate support 14 can be supported by a support mechanism 13. The support mechanism 13 extends upward from the bottom of the chamber 12 in the space 12c. The support mechanism 13 may have a substantially cylindrical shape. The support mechanism 13 can be made of an insulating material such as quartz.

The substrate support 14 includes an electrostatic chuck 16 and a lower electrode 18. The lower electrode 18 includes a first plate 18a and a second plate 18b. The first plate 18a and the second plate 18b are made of metal such as aluminum. The first plate 18a and the second plate 18b have a substantially cylindrical shape, for example. The second plate 18b is disposed on the first plate 18a. The second plate 18b is electrically connected to the first plate 18a.

The electrostatic chuck 16 is disposed on the second plate 18b. The electrostatic chuck 16 includes an insulating layer and a thin film electrode disposed in the insulating layer. A DC power supply 22 is electrically connected to the thin film electrode of the electrostatic chuck 16 through a switch 23. The electrostatic chuck 16 generates an electrostatic force from a DC voltage of the DC power supply 22. The electrostatic chuck 16 adsorbs and holds the substrate W by the generated electrostatic force.

In the substrate processing apparatus 10, an edge ring ER is disposed on the second plate 18b and around the second plate 18b to surround the outer peripheries of the substrate W and the electrostatic chuck 16. The edge ring ER has a role of improving the uniformity of a process. The edge ring ER is made of, for example, silicon.

A flow path 24 is formed in the second plate 18b. A heat exchange medium for temperature control, such as a coolant, is supplied from a temperature controller (for example, chiller unit) disposed outside the chamber 12 to the flow path 24. The temperature controller controls the temperature of the heat exchange medium. The heat exchange medium is supplied from the temperature controller to the flow path 24 through a pipe 26a. The heat exchange medium supplied from the temperature controller to the flow path 24 through the pipe 26a is fed back to the temperature controller through a pipe 26b. The heat exchange medium is brought back to the flow path 24 in the substrate support 14 after the temperature control is performed by the temperature controller. In this manner, it is possible to control the temperature of the substrate support 14, that is, the temperature of the substrate W.

The substrate processing apparatus 10 further includes a gas supply line 28 extending to the upper surface of the electrostatic chuck 16 through the substrate support 14. A heat exchange gas such as a helium (He) gas is supplied from a heat-exchange gas supply mechanism through the gas supply line 28 into a space between the upper surface of the electrostatic chuck 16 and the lower surface of the substrate W. Heat exchange between the substrate support 14 and the substrate W is accelerated by the heat exchange gas.

Further, a heater HT may be disposed in the substrate support 14. The heater HT is a heating device. The heater HT is buried in the second plate 18b or the electrostatic chuck 16, for example. The heater HT is connected to a heater power supply HP. The temperature of the substrate support 14 and thus the temperature of the substrate W are adjusted by the heater power supply HP supplying the power to the heater HT.

A radio-frequency (RF) power supply 30 is connected to the lower electrode 18 of the substrate support 14 through a matcher 32. The radio-frequency power supply 30 is an example of a radio-frequency power supply for bias. The radio-frequency power supply 30 supplies radio-frequency power for bias to the substrate support 14 to attract ions to the substrate W placed on the substrate support 14. The frequency of the radio-frequency power generated by the radio-frequency power supply 30 is, for example, in a range of 400 kHz to 40.68 MHz. In an example, the frequency of the radio-frequency power is 13.56 MHz.

The matcher 32 includes a circuit that performs matching between the output impedance from the radio-frequency power supply 30 and the impedance on a load side, that is, the lower electrode 18 side.

The substrate processing apparatus 10 further includes a shield 34 detachably attached to the inner wall of the chamber 12. The shield 34 is also disposed to surround the outer periphery of the support mechanism 13. The shield 34 prevents adhering of by-products generated by the processing to the chamber 12. The shield 34 may be an aluminum member coated with ceramic such as $Y_2O_3$.

An exhaust path is formed between the substrate support 14 and the side wall of the chamber 12. The exhaust path is connected to an exhaust port 12e formed at the bottom of the chamber 12. The exhaust port 12e is connected to an exhaust device 38 through a pipe 36. The exhaust device 38 includes a pressure adjuster and a vacuum pump such as a turbo molecular pump (TMP). A baffle plate 40 is disposed in the exhaust path, that is, between the substrate support 14 and the side wall of the chamber 12. The baffle plate 40 has plural through-holes penetrating the baffle plate 40 in a thickness direction. The baffle plate 40 may be an aluminum member having a surface coated with ceramic such as $Y_2O_3$.

An opening is formed on the upper side of the chamber 12. The opening is closed by a dielectric window 42. The dielectric window 42 is formed of quartz or the like. The dielectric window 42 is, for example, a flat plate.

A gas supply port 12i is formed in the side wall of the chamber 12. The gas supply port 12i is connected to a gas supply 44 through a gas supply pipe 46. The gas supply 44 supplies various gases used for the processing to the space 12c. The gas supply 44 includes a plurality of gas sources 44a, a plurality of flow rate controllers 44b, and a plurality of valves 44c. Although not explicitly illustrated in FIG. 1, a gas supply port different for each gas to be supplied may be provided to thus prevent a mixture of gases.

The plural gas sources 44a include gas sources of various gases described later. One gas source may supply one or more gases. The plural flow rate controllers 44b may be mass flow controllers (MFCs). The flow rate controller 44b implements flow rate control by pressure control. Each gas source included in the plural gas sources 44a is connected to the gas supply port 12i through the corresponding one of the plural flow rate controllers 44b and the corresponding one of the plural valves 44c. The position of the gas supply port 12i is not particularly limited. For example, the gas supply port 12i may be formed in the dielectric window 42, instead of the side wall of the chamber 12.

An opening 12p is formed in the side wall of the chamber 12. The opening 12p serves as a carrying-in/out path for the substrate W. The substrate W is carried from the outside into the space 12c of the chamber 12 through the opening 12p, and carried from the space 12c to the outside of the chamber 12. A gate valve 48 is provided on the side wall of the chamber 12, and thus the opening 12p can be opened and closed.

An antenna 50 and a shield 60 are disposed on the chamber 12 and the dielectric window 42. The antenna 50 and the shield 60 are disposed outside the chamber 12. In one embodiment, the antenna 50 includes an inner antenna element 52A and an outer antenna element 52B. The inner antenna element 52A is a spiral coil disposed at the center of the dielectric window 42. The outer antenna element 52B is a spiral coil disposed on the dielectric window 42 and on the outer peripheral side of the inner antenna element 52A. Each of the inner antenna element 52A and the outer antenna element 52B is made of a conductive material such as copper, aluminum, or stainless steel.

The inner antenna element 52A and the outer antenna element 52B are gripped and held together by a plurality of clamps 54. Each of the clamps 54 is rod-shaped. The plural clamps 54 extend in a radial direction from the substantially center of the inner antenna element 52A to the outer peripheral side of the outer antenna element 52B.

The antenna 50 is covered with a shield 60. The shield 60 includes an inner shield wall 62A and an outer shield wall 62B. The inner shield wall 62A has a cylindrical shape. The inner shield wall 62A is disposed between the inner antenna element 52A and the outer antenna element 52B, and surrounds the inner antenna element 52A. The outer shield wall 62B has a cylindrical shape. The outer shield wall 62B is disposed outside the outer antenna element 52B, and surrounds the outer antenna element 52B.

An inner shield plate 64A having a disk shape is disposed above the inner antenna element 52A. The inner shield plate 64A covers the opening of the inner shield wall 62A. An outer shield plate 64B having a flat ring shape is disposed above the outer antenna element 52B. The outer shield plate 64B covers an opening between the inner shield wall 62A and the outer shield wall 62B.

The shapes of the shield walls and the shield plates included in the shield 60 are not limited to the shapes described above. For example, the shield wall of the shield 60 may have a prism shape having a quadrangular cross-section.

The inner antenna element 52A and the outer antenna element 52B are connected to a radio-frequency power supply 70A and a radio-frequency power supply 70B, respectively. The radio-frequency power supply 70A and the radio-frequency power supply 70B are examples of a radio-frequency power supply for plasma generation. The inner antenna element 52A and the outer antenna element 52B receive supplied power having the same or different frequencies from the radio-frequency power supply 70A and the radio-frequency power supply 70B, respectively. When the radio-frequency power is supplied from the radio-frequency power supply 70A to the inner antenna element 52A, an induced magnetic field is generated in the space 12c to excite the gas in the space 12c and generate plasma above the center of the substrate W. In addition, when the radio-frequency power is supplied from the radio-frequency power supply 70B to the outer antenna element 52B, an induced magnetic field is generated in the space 12c to excite the gas in the space 12c and generate plasma in a ring shape above the outer peripheral portion of the substrate W.

The electric lengths of the inner antenna element 52A and the outer antenna element 52B are adjusted in accordance with the frequencies output from the radio-frequency power supply 70A and the radio-frequency power supply 70B, respectively. Therefore, the positions of the inner shield plate 64A and the outer shield plate 64B in a z-axis direction are adjusted independently by actuators 68A and 68B, respectively.

The substrate processing apparatus 10 further includes a controller 80. The controller 80 is, for example, a computer including a processor, a storage such as a memory, an input unit, a display, and the like. The controller 80 operates based on a control program or recipe data stored in the storage to control the components of the substrate processing apparatus 10. For example, the controller 80 controls the plural flow rate controllers 44b, the plural valves 44c, the exhaust device 38, the radio-frequency power supplies 70A and 70B, the radio-frequency power supply 30, the matcher 32, the heater power supply HP, and the like. The controller 80 reads a program or data from the storage to control the components of the substrate processing apparatus 10. In this manner, the controller 80 performs substrate processing of a substrate processing method according to the embodiment, which will be described later.

(Example of Processing Flow of Substrate Processing Method)

The substrate processing apparatus 10 performs substrate processing by a substrate processing method described below. The substrate processing apparatus 10 performs pre-coating on the inside of the chamber 12, in which the substrate W is disposed, before performing the substrate processing by the substrate processing method described later. A case where the substrate processing apparatus 10 performs plasma processing such as plasma etching, as the substrate processing, will be described below as an example.

Figure 2:
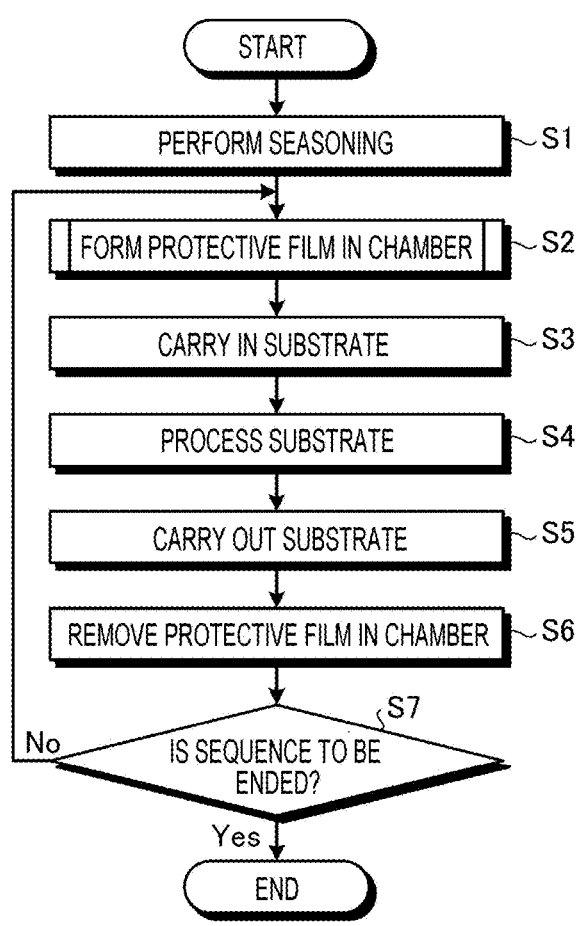
FIG. 2 is a flowchart illustrating an example of a substrate processing method according to an embodiment.

FIG. 2 is a flowchart illustrating an example of a substrate processing method according to an embodiment. The substrate processing apparatus 10 according to the embodiment performs plasma processing on a substrate W such as a semiconductor substrate by the substrate processing method.

In Step S1, seasoning is performed such that the inside of the chamber 12 is in a state suitable for the substrate processing. In the seasoning, for example, a dummy wafer is placed on the substrate support 14 before plasma processing on the first substrate W is started. Then, plasma is generated to raise the temperature of the inner surface of the chamber 12.

In Step S2, the inside of the chamber 12 is pre-coated. The details of this pre-coating step will be described later.

In Step S3, the substrate W is carried into the chamber 12 through the opening 12p, and then the substrate W is placed on the substrate support 14. In Step S4, plasma processing is performed on the substrate W. For example, in Step S4, plasma etching is performed on the substrate W. In Step S5, the plasma-processed substrate W is carried out from the chamber 12 through the opening 12p. In Step S6, the pre-coated film is removed from the inside of the chamber 12.

In Step S7, it is determined whether or not the sequence of the substrate processing is to be ended. For example, when there is an unprocessed substrate W in the lot, it is determined that the sequence is not to be ended (Step S7: No), and the process proceeds to Step S2. Thus, the unprocessed substrate W is carried in, and plasma processing is performed. When the plasma processing has been performed on all substrates W in the lot, it is determined that the sequence is to be ended (Step S7: Yes), and the processing is ended.

The step of removing the pre-coat film in Step S6 may not be performed. The step of removing the pre-coat film in Step S6 may be performed only once when the sequence is ended. Further, in a case where the pre-coat film can withstand a plurality of times of substrate processing, the pre-coating step of Step S2 may not be performed for each substrate W, but may be performed for each of a plurality of times of substrate processing in which the pre-coated film can withstand.

First Example of Pre-coating

In pre-coating in the related art, a pre-coat film is formed in the chamber 12 by plasma generated from a gas that includes a film-forming material. However, when ions in the plasma are incident on parts in the chamber 12 after the start of the pre-coating and before the pre-coat film is formed, particles are generated.

Figure 3:
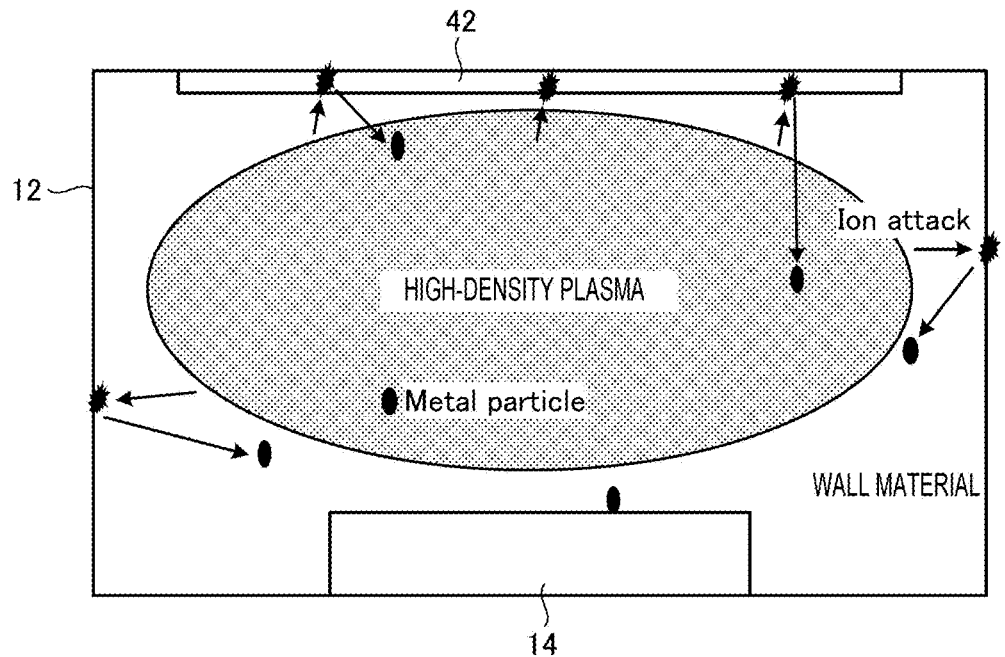
FIG. 3 is a diagram schematically illustrating a state in a chamber during a pre-coating in a related art.

FIG. 3 is a diagram schematically illustrating a state in the chamber 12 during pre-coating in the related art. FIG. 3 is a simplified view of the inside of the chamber 12. The substrate support 14 is disposed in the chamber 12. When plasma is generated in the chamber 12, ions are incident on parts disposed in the chamber, such as the inner wall of the chamber 12, the substrate support 14, and the dielectric window 42 (referred to as "in-chamber parts" below), and particles are generated in the chamber 12. For example, the ion flux $\Gamma_I$ at which in-chamber parts are sputtered have a relation represented by Expression (1) as follows, with the plasma density Ne and the electron temperature Te.

$$\Gamma_I \propto Ne \times (Te)^{1/2} \quad (1)$$

Thus, when the plasma density Ne increases, the ion flux $\Gamma_I$ increases, so that the generation amount of particles increases.

Figure 4:
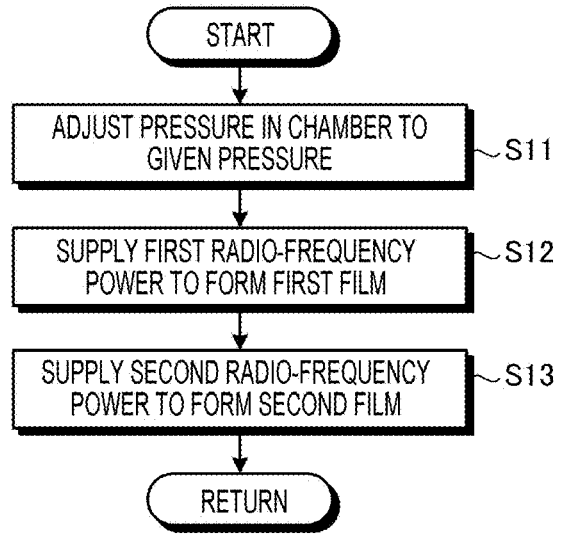
FIG. 4 is a flowchart illustrating an example of a pre-coating step in a substrate processing method according to an embodiment.

Therefore, in the substrate processing method according to the embodiment, the pre-coating step is performed as follows. FIG. 4 is a flowchart illustrating an example of a pre-coating step in a substrate processing method according to an embodiment.

In Step S11, the exhaust device 38 is controlled to adjust the pressure of the in-chamber part to a predetermined pressure suitable for pre-coating. The pressure in the chamber 12 is set to be equal to or larger than 100 mTorr, for example.

In Step S12, a first film of the pre-coat film is formed on the in-chamber part by supplying a reaction gas from the gas supply 44 into the chamber 12. The reaction gas includes components of the first film. In Step S12, the first film of the pre-coat film is formed on the in-chamber part by chemical vapor deposition (CVD), for example. Specifically, the first film may be formed by supplying radio-frequency power for plasma generation from the radio-frequency power supply 70A and the radio-frequency power supply 70B and generating first plasma from the reaction gas. At this time, the first plasma is generated under a condition that sputtering on the in-chamber part can be suppressed. For example, in Step S12, sputtering on the in-chamber part by the first plasma may be suppressed by controlling at least one of the radio-frequency power for plasma generation, the radio-frequency power for bias, the pressure in the chamber, and the temperature in the chamber. Further, in a case where the reaction gas contains a halogen-containing gas, sputtering on the in-chamber part by the first plasma may be suppressed by the concentration of the halogen-containing gas. In an example, by controlling the radio-frequency power for plasma generation and adjusting the potential difference between the in-chamber part and the plasma to be equal to or smaller than 100 V or equal to or smaller than 50 V, it is possible to suppress sputtering on the in-chamber part.

In Step S12, the first film may be formed by atomic layer deposition (ALD). In the case of ALD, a first reaction gas is supplied into the chamber 12, and the first reaction gas is adsorbed to the in-chamber part. At this time, the excess first reaction gas that has not been adsorbed to the in-chamber part may be purged from the chamber 12. Then, by supplying a second reaction gas into the chamber 12, and causing the plasma (first plasma) generated from the second reaction gas to react with the first reaction gas adsorbed to the in-chamber part, the first film is formed. According to the ALD, it is possible to form the first film on the in-chamber part without unevenness at the plasma density Ne lower than the plasma density of the CVD.

Step S12 is performed until the film thickness of the first film reaches a given thickness enabled to protect the in-chamber part from the sputtering with plasma in the subsequent Step S13.

In Step S13, the reaction gas including the components of a second film is supplied from the gas supply 44 into the chamber 12, and the second film is formed on the surface of the first film by using second plasma generated from this reaction gas. The first film and the second film may be the same type of film or different types of film. The second film can be formed by, for example, CVD. Specifically, the second film is formed by supplying the reaction gas that includes the components of the second film into the chamber 12, and generating the plasma (second plasma) from the reaction gas. At this time, the first film formed in Step S12 protects the in-chamber part from the sputtering with the second plasma. Therefore, in Step S13, it is possible to suppress the generation of particles during pre-coating.

The conditions for the pre-coating in Step S13 are not particularly limited as long as the in-chamber part is protected by the first film from the sputtering with the second plasma. For example, when the first film is formed by CVD in Step S12, conditions of satisfying, for example, at least one of cases (1) to (4) as follows can be selected in accordance with the conditions for the pre-coating in Step S12.

(1) The radio-frequency power for plasma generation, which is supplied in Step S13, is larger than the radio-frequency power for plasma generation, which is supplied in Step S12.

(2) The radio-frequency power for bias, which is supplied in Step S13, is larger than the radio-frequency power for bias, which is supplied in Step S12.

(3) The temperature in the chamber in Step S13 is higher than the temperature in the chamber in Step S12.

(4) When the reaction gas contains a halogen-containing gas, the concentration of the halogen-containing gas in Step S13 is higher than the concentration of the halogen-containing gas in Step S12.

Step S13 is performed until the film thickness of the pre-coat film formed by the first film and the second film reaches a thickness enabling protection of the in-chamber part from plasma processing. Then, the process proceeds to Step S3 in FIG. 2.

As the pre-coat film, for example, a silicon-containing film, an organic film, or a metal-containing film can be used. As the silicon-containing film, for example, a silicon oxide film or a silicon nitride film can be used. As the metal-containing film, a film containing metal such as titanium (Ti), tantalum (Ta), ruthenium (Ru), aluminum (Al), hafnium (Hf), or tin (Sn), or a film containing an oxide, a nitride, a sulfide, or a halide of the above metal can be used.

Examples of materials for forming various pre-coat films will be described below.

When the silicon-containing film is formed by CVD, a gas mixture of a silicon-containing gas with an oxygen-containing gas or a nitrogen-containing gas can be used as the reaction gas. When the silicon-containing film is formed by ALD, a silicon-containing gas can be used as the first reaction gas, and an oxygen-containing gas or a nitrogen-containing gas can be used as the second reaction gas. More specifically, when the silicon oxide film is formed, a gas containing aminosilane, $SiCl_4$, $SiF_4$, or the like can be used as the silicon-containing gas, and an $O_2$ gas or the like can be used as the oxygen-containing gas. Further, when the silicon nitride film is formed, a gas containing aminosilane, $SiCl_4$, dichlorosilane, hexachlorodisilane, or the like can be used as the silicon-containing gas, and an $NH_2$ gas, an $N_2$ gas, or the like can be used as the nitrogen-containing gas.

The organic film can be formed, for example, by generating plasma from a carbon-containing gas such as a $C_2H_4$. Further, the organic film can be formed in a manner as follows. The first reaction gas of epoxides, carboxylic acids, carboxylic halides, carboxylic anhydrides, isocyanates, phenols, or the like is supplied into the chamber 12, and the first reaction gas is adsorbed to the in-chamber part. Then, the first reaction gas adsorbed to the in-chamber part is caused to react with the plasma generated from the second reaction gas such as an inorganic compound gas having an N—H bond, an inert gas, a gas mixture of $N_2$ and $H_2$, an $H_2O$ gas, and a gas mixture of $H_2$ and $O_2$.

When the metal-containing film is formed by CVD, a gas mixture of a metal-containing gas with an oxidizing gas or a reducing gas can be used as the reaction gas. When the metal-containing film is formed by ALD, a metal-containing gas can be used as the first reaction gas, and an oxidizing gas or a reducing gas can be used as the second reaction gas. More specifically, a gas containing metal such as Ti, Ta, Ru, Al, Hf, or Sn, or a gas containing an oxide, a nitride, a sulfide, or a halide of the above metal can be used as the first reaction gas. A hydrogen-containing gas such as an $H_2$ gas, an oxygen-containing gas such as an $O_2$ gas, a gas mixture of an $H_2$ gas and an $N_2$ gas, or a hydrogen-and-nitrogen-containing gas such as an $NH_3$ gas can be used as the second reaction gas. A metal-containing film can be formed when a hydrogen-containing gas is used as the second reaction gas. A metal oxide film can be formed when an oxygen-containing gas is used as the second reaction gas. A metal nitride film can be formed when a hydrogen-and-nitrogen-containing gas is used as the second reaction gas.

Figure 5:
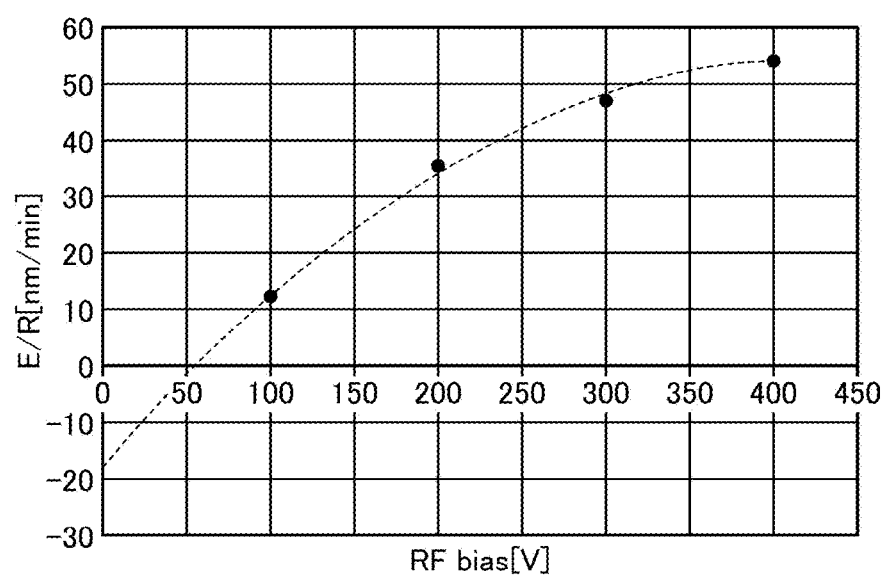
FIG. 5 is a view illustrating an example of an etching rate according to an embodiment.

Here, the condition when the first film is formed by CVD in Step S12 will be described in more detail. The sputtering rate for the in-chamber part when the first film of the pre-coat film is formed changes depending on the potential of the in-chamber part. FIG. 5 is a view illustrating an example of an etching rate according to an embodiment. FIG. 5 illustrates the etching rate when a $Y_2O_3$ film formed on a silicon substrate is plasma-etched using a $Cl_2$ gas. The vertical axis in FIG. 5 indicates the etching rate (E/R). The horizontal axis indicates the RF bias voltage. The etching rate corresponds to the sputtering rate of the in-chamber part. The RF bias voltage corresponds to the potential difference between the plasma and the in-chamber part. The RF bias voltage increases or decreases in accordance with the magnitude of the radio-frequency power for bias, which is supplied from the radio-frequency power supply 30. As illustrated in FIG. 5, the etching rate decreases when the RF bias voltage decreases. For example, the etching rate decreases when the RF bias voltage is equal to or smaller than 100 V, and the etching rate becomes negative when the RF bias voltage is equal to or smaller than 50 V. Therefore, it is considered that sputtering on the in-chamber part is significantly suppressed when the potential of the in-chamber part is equal to or smaller than 100 V. Further, when the potential of the in-chamber part is equal to or smaller than 50 V, it is considered that sputtering of the in-chamber part hardly occurs. Thus, when the potential of the in-chamber part during the pre-coating is equal to or smaller than 100 V or equal to or smaller than 50 V, it is considered that it is possible to suppress sputtering on the in-chamber part. For example, it is possible to suppress sputtering on the in-chamber part by setting the potential difference between the in-chamber part and the plasma to be equal to or smaller than 100 V or equal to or smaller than 50 V.

The conditions for controlling the potential of the in-chamber part in the above range vary depending on the structure of the chamber 12, the magnitude of the radio-frequency power for plasma generation, the magnitude of the radio-frequency power for bias, and the plasma generation method (ICP, CCP, SWP, or the like). The potential of the in-chamber part varies depending on the type of gas supplied into the chamber 12 and the pressure in the chamber 12.

Therefore, in the substrate processing apparatus 10, the condition under which the potential of the in-chamber part can be controlled to be in the above range may be obtained in advance, and the first film may be formed under the obtained condition. For example, the radio-frequency power for plasma generation, that causes the potential difference between the in-chamber part and the plasma to be 100 V or 50 V, is obtained, and data of the obtained radio-frequency power is stored in the storage of the controller 80. In the substrate processing method according to the embodiment, in Step S12, the controller 80 controls the radio-frequency power supplied from the radio-frequency power supply 70A and the radio-frequency power supply 70B for plasma generation, based on the data stored in the storage of the controller 80. For example, the controller 80 controls the radio-frequency power supply 70A and the radio-frequency power supply 70B to supply the radio-frequency power for plasma generation, that causes the potential difference between the in-chamber part and the plasma to be equal to or smaller than 50 V or equal to or smaller than 100 V. Thus, without sputtering on the in-chamber part, the first film is formed, and the inside of the chamber 12 is pre-coated.

Figure 6:
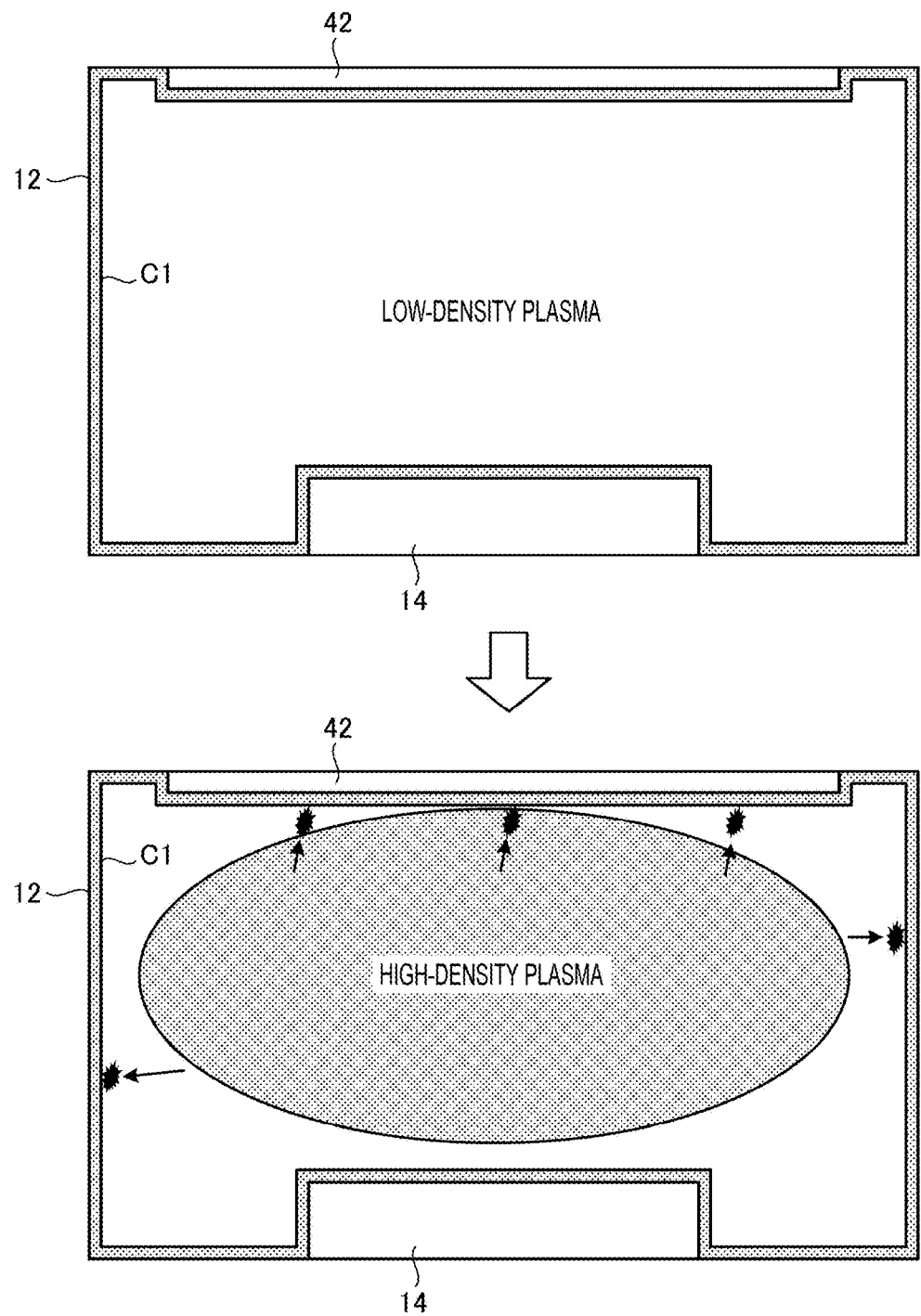
FIG. 6 is a diagram schematically illustrating a state in a chamber in a pre-coating step according to an embodiment.

FIG. 6 is a view schematically illustrating a state in the chamber 12 in the pre-coating step according to the embodiment. Similar to FIG. 3, FIG. 6 is a simplified view of the inside of the chamber 12. For example, in Step S12, as in the upper figure, low-density plasma is generated in the chamber 12, and the in-chamber part is coated with a first film C1. In Step S13, as in the lower figure, high-density plasma is generated in the chamber 12. At this time, ions are incident on the in-chamber part. However, since the in-chamber part is coated with the first film C1, the generation of particles is suppressed.

Figure 7:
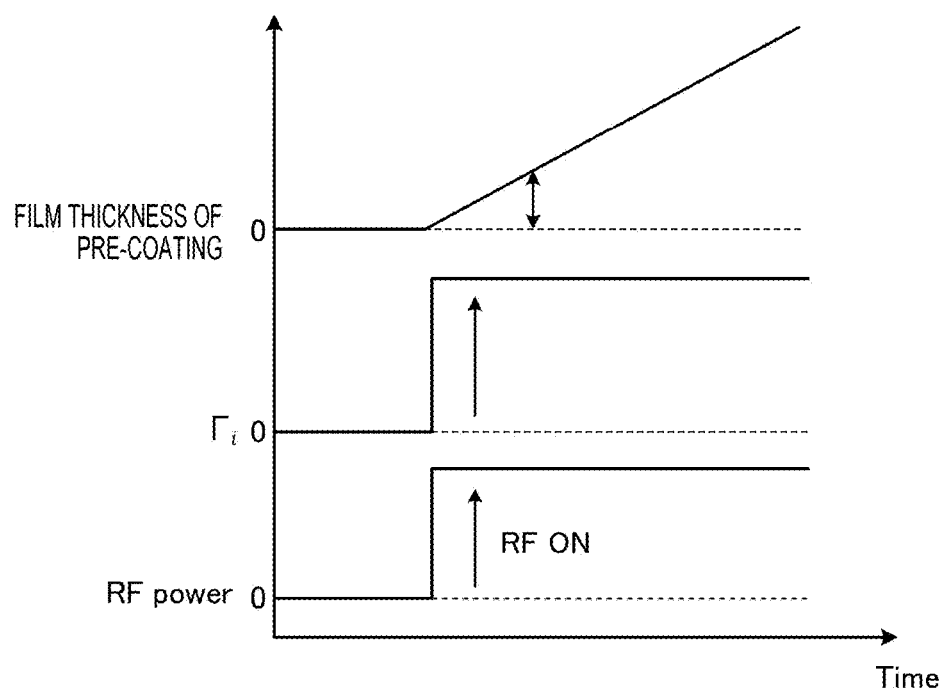
FIG. 7 is a view illustrating an example of a change in film thickness in a pre-coating in a related art.

Here, the change in film thickness in the pre-coating in the related art and the change in film thickness in the pre-coating according to the embodiment will be described. FIG. 7 is a view illustrating an example of a change in film thickness in a pre-coating in a related art. FIG. 7 illustrates the changes over time in the radio-frequency power for plasma generation, the amount of the generated ion flux $\Gamma_I$, and the film thickness of the pre-coating. In the pre-coating in the related art, high-density plasma is generated in the chamber 12. When the high-density plasma is generated, the ion flux $\Gamma_I$ abruptly increases. Thus, ions may be incident on the in-chamber part and particles may be generated, before the pre-coat film is formed or before the pre-coat film becomes sufficiently thick.

Figure 8:
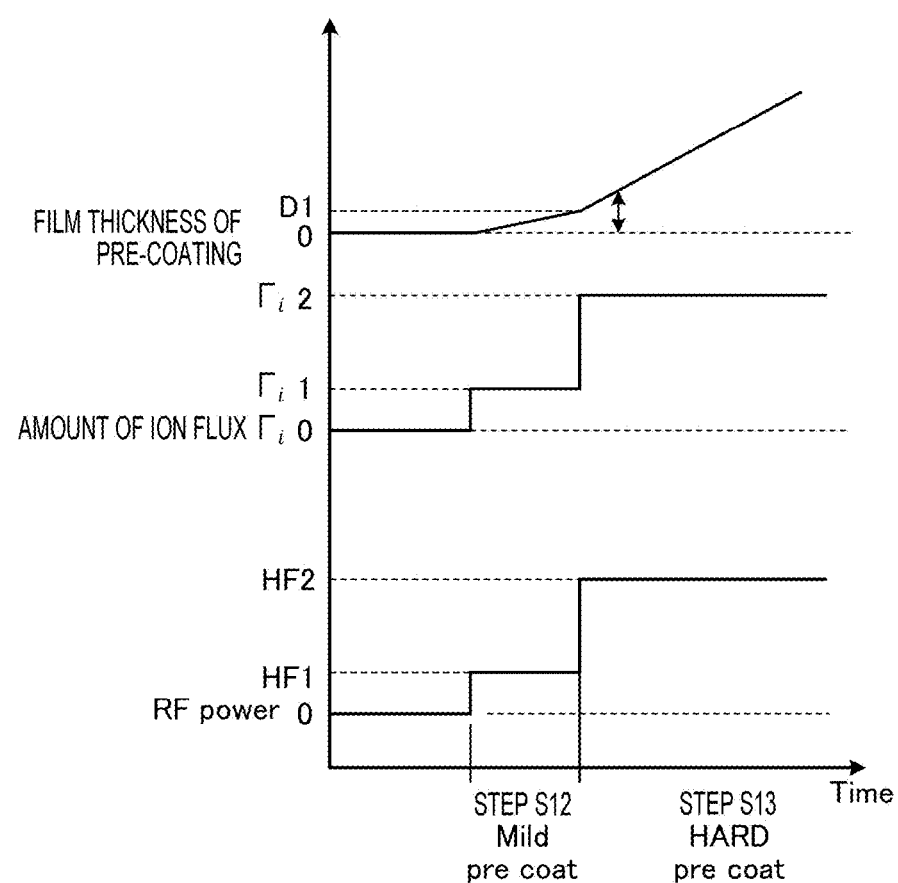
FIG. 8 is a view illustrating an example of a change in film thickness in a pre-coating according to an embodiment.

FIG. 8 is a view illustrating an example of a change in film thickness in a pre-coating according to an embodiment. FIG. 8 illustrates the changes over time in the radio-frequency power (RF power) for plasma generation, the amount Γi of the generated ion flux, and the film thickness D of the pre-coating. In Step S12, radio-frequency power HF1 for plasma generation is supplied to generate low-density plasma (first plasma) in the chamber 12. In Step S12, since the plasma has low density, the amount Γi1 of the ion flux is small, and the film formation rate is low. When the first film C1 formed in Step S12 has a given thickness D1, the process proceeds to Step S13. In Step S13, radio-frequency power HF2 for plasma generation is supplied to generate high-density plasma (second plasma) in the chamber 12. In Step S13, since the plasma has high density, the film formation rate becomes high, and the second film can be quickly formed. In Step S13, since the plasma has high density, the amount Γi2 of the ion flux increases, but, the first film C1 can protect the in-chamber part from the sputtering with the second plasma. As described above, the pre-coating according to the embodiment can be quickly performed while the generation of particles is suppressed.

Figure 9:
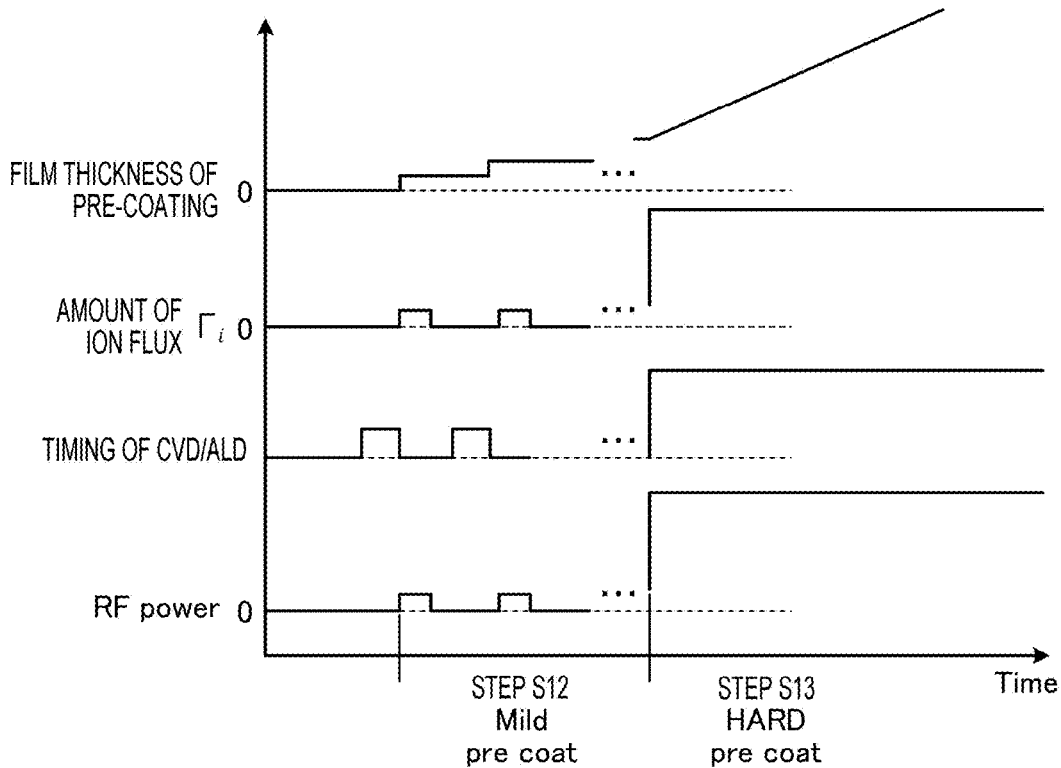
FIG. 9 is a view illustrating another example of a change in film thickness in a pre-coating step according to an embodiment.

A case where the films are continuously formed in Step S12 has been described as an example with reference to FIG. 8. However, the present disclosure is not limited thereto. In Step S12, the films may be intermittently formed. FIG. 9 is a view illustrating another example of a change in film thickness in a pre-coating step according to an embodiment. FIG. 9 illustrates the changes over time in the radio-frequency power (RF power) for plasma generation, the timing for performing ALD or CVD, the amount Γi of the generated ion flux, and the film thickness D of the pre-coating. In Step S12, a gas of the material for the pre-coating and radio-frequency power HF for plasma generation are intermittently supplied to form a film.

Figure 10:
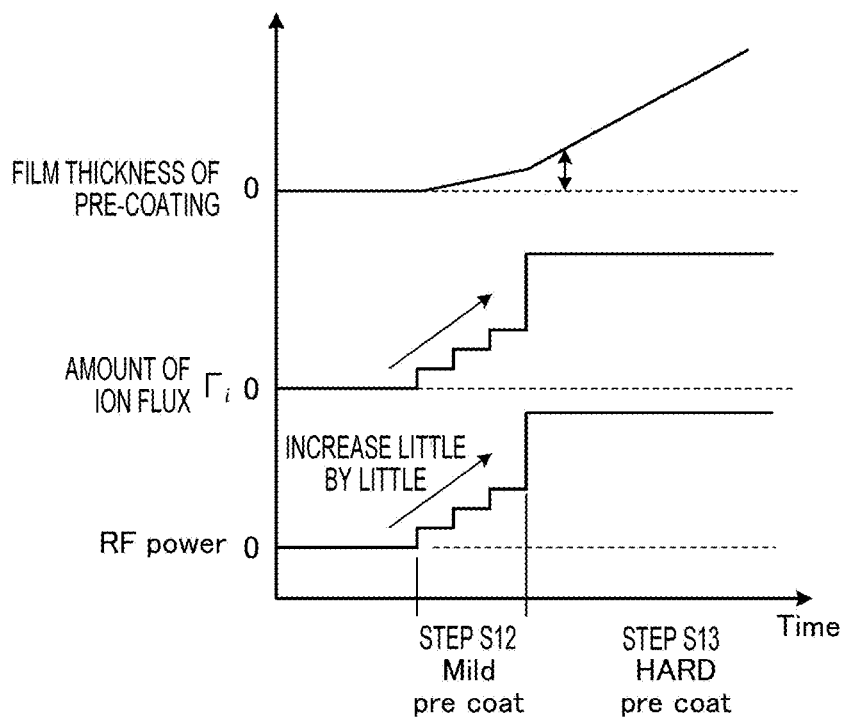
FIG. 10 is a view illustrating an example in which a radio-frequency power for plasma generation is increased in a pre-coating step according to an embodiment.

Further, in Step S12, the radio-frequency power for plasma generation may be increased in accordance with the increase in the film thickness of the first film. FIG. 10 is a view illustrating an example in which a radio-frequency power for plasma generation is increased in a pre-coating step according to an embodiment. FIG. 10 illustrates the changes over time in the radio-frequency power (RF power) for plasma generation, the amount Γi of the generated ion flux, and the film thickness D of the pre-coating. In Step S12, the radio-frequency power for plasma generation is stepwise increased in accordance with the increase in the film thickness D to form a film.

In Step S12, whether ions reach the in-chamber part to damage the in-chamber part and particles are scattered is determined by a relation between the energy of the ions and the thickness of the first film C1. Therefore, in Step S12, the radio-frequency power for plasma generation may be increased in accordance with the increase in the film thickness of the first film C1, within a range in which the ions do not penetrate the first film C1.

Figure 11:
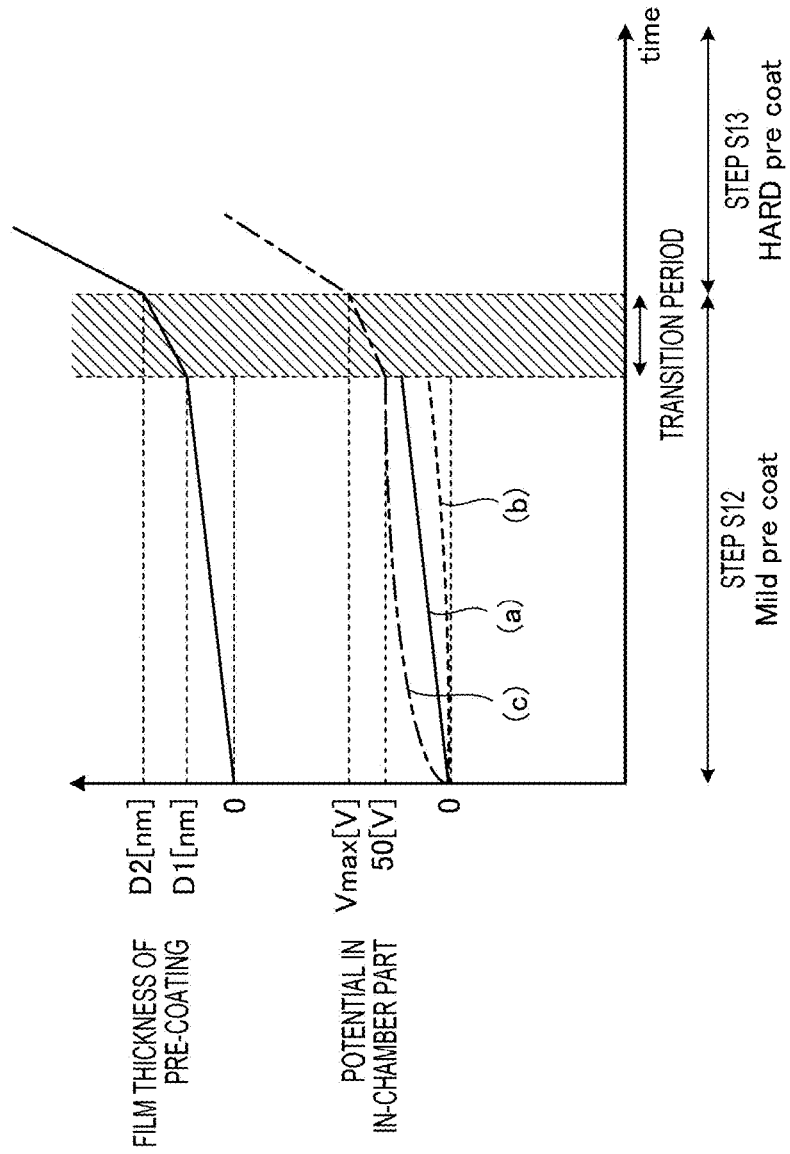
FIG. 11 is a view illustrating another example in which a radio-frequency power for plasma generation is increased in a pre-coating step according to an embodiment.

FIG. 11 is a view illustrating another example in which a radio-frequency power for plasma generation is increased in a pre-coating step according to an embodiment. FIG. 11 illustrates the changes over time in the radio-frequency power (RF power) for plasma generation and the film thickness of the pre-coat film. In Step S12, first, the RF power for bias is adjusted so that the potential difference between the in-chamber part and the plasma is equal to or smaller than 50 V, and then the first film C1 is formed until the film thickness reaches D1. The radio-frequency power for plasma generation, which is supplied until the film thickness reaches D1, may be constant or vary as long as the potential difference between the in-chamber part and the plasma is equal to or smaller than 50 V. For example, the radio-frequency power for plasma generation may be caused to vary so that the potential difference between the plasma and the in-chamber part increases at a constant rate as illustrated in (a) in FIG. 11. Alternatively, the radio-frequency power for plasma generation may be caused to vary so that the increase rate gradually increases or decreases as illustrated in (b) and (c) in FIG. 11. After the film thickness of the first film C1 reaches D1, the first film C1 may be formed as a transition period, until the first film C1 reaches a film thickness D2 that keeps ions from penetrating the first film C1, while increasing the radio-frequency power for plasma generation in a range in which the ions do not penetrate the first film C1. After the film thickness reaches D2, the ions do not penetrate the first film C1, and thus the process proceeds to Step S13 in which the film formation rate is high.

Figure 12:
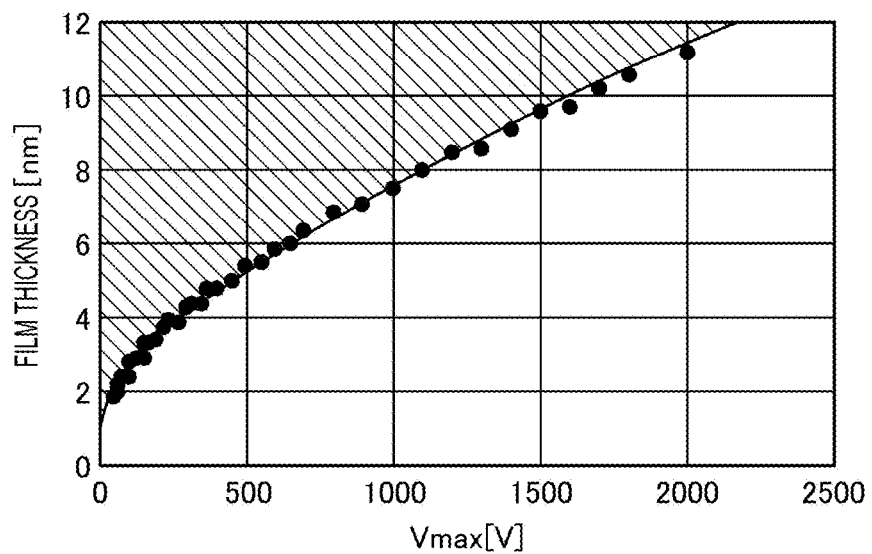
FIG. 12 is a view illustrating an example of a relationship between a film thickness of a pre-coat film and an ion energy of ions penetrating the pre-coat film.
Figure 13:
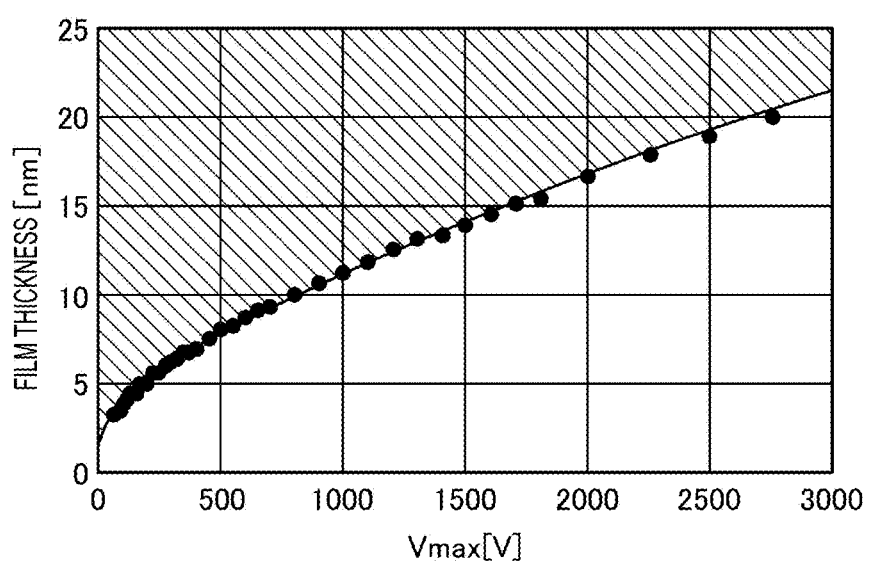
FIG. 13 is a view illustrating an example of a relationship between a film thickness of a pre-coat film and an ion energy of ions penetrating the pre-coat film.

In the transition period, the RF power for bias may be increased in a range in which the ions do not penetrate the first film C1. FIGS. 12 and 13 are views illustrating an example of the relation between the film thickness of the pre-coat film and the ion energy of ions penetrating the pre-coat film. FIG. 12 illustrates an example in which a $SiO_2$ film is formed as the pre-coat film. FIG. 13 illustrates an example in which an organic film is formed as the pre-coat film. FIGS. 12 and 13 illustrate the relation between the film thickness of the pre-coat film and the ion energy (Vmax) required for the ions to penetrate the pre-coat film having the film thickness. As illustrated in FIGS. 12 and 13, the thicker the film thickness, the larger the ion energy required to penetrate the pre-coat film. In FIGS. 12 and 13, a hatched region indicates the range of the film thickness keeping ions from penetrating. The film thickness D2 is set to be the film thickness of the hatched region in which ions do not penetrate even with the ion energy of the ions generated in Step S12. In the transition period, the first film C1 is deposited to have the film thickness D2 that keeps ions generated in Step S12 from penetrating even with the maximum ion energy of the ions. Thus, the ions do not penetrate the first film C1, and thus it is possible to suppress the generation of particles.

Second Example of Pre-coating

In the above-described first example of the pre-coating, the first film is formed using plasma. The first film can also be formed without using plasma. In this case, for example, a gas containing a first organic compound and a gas containing a second organic compound can be used as the reaction gas. The second organic compound may be an organic compound different from the first organic compound.

In Step S12 in the second example, the gas containing the first organic compound is supplied into the chamber 12, and the first organic compound is adsorbed onto the surface of the in-chamber part. At this time, the first organic compound that has not been adsorbed to the in-chamber part may be purged from the chamber 12. Then, the first film is formed by supplying the gas containing the second organic compound into the chamber 12, and polymerizing the first organic compound adsorbed onto the surface of the in-chamber part and the second organic compound. In the second example, the plasma is not used when the first film is formed. Thus, sputtering with the first plasma is not performed on the in-chamber part.

In the second example, as the first organic compound, for example, isocyanates, carboxylic acids, carboxylic halides, or the like can be used. Further, as the second organic compound, for example, an amine or a compound having a hydroxyl group can be used. Further, for example, carboxylic anhydrides can be used as the first organic compound, and an amine can be used as the second organic compound. Further, for example, bisphenol A can also be used as the first organic compound, and diphenyl carbonate or epichlorohydrin can also be used as the second organic compound. Whichever organic compound is used, in order to accelerate the polymerization reaction, the in-chamber part may be heated by a heater or the like.

(Effects)

As described above, the substrate processing according to the embodiment includes (a) the step (Steps S2 and S11 to S13) of forming the pre-coat film on the in-chamber part (for example, the inner wall of the chamber 12, the substrate support 14, and the dielectric window 42) disposed in the chamber 12, and (b) the step (Step S4) of processing one or more substrates after the step (a). The step (a) includes (a1) the step (Step S12) of forming the first film on the in-chamber part without using the plasma or by using the first plasma generated under a condition that suppression of sputtering on the in-chamber part is enabled, and (a2) the step (Step S13) of forming the second film on the surface of the first film by using the second plasma. Thus, in the substrate processing according to the embodiment, it is possible to perform pre-coating on the inside of the chamber 12 while the generation of particles is suppressed.

In the substrate processing according to the embodiment, in the step (a1), the first film is formed on the in-chamber part by using the first plasma generated from the reaction gas under the condition that the suppression of sputtering on the in-chamber part is enabled. Thus, in the substrate processing according to the embodiment, it is possible to suppress sputtering on the in-chamber part when the first film is formed.

In the substrate processing according to the embodiment, the step (a1) is performed under a condition of satisfying at least one of (1) case where a radio-frequency power for plasma generation, which is supplied in the step (a2) is larger than a radio-frequency power for plasma generation, which is supplied in the step (a1), (2) case where a radio-frequency power for bias, which is supplied in the step (a2) is larger than a radio-frequency power for bias, which is supplied in the step (a1), (3) case where a temperature in the chamber in the step (a2) is higher than a temperature in the chamber in the step (a1), and (4) case where the reaction gas contains a halogen-containing gas, and concentration of the halogen-containing gas in the step (a2) is higher than concentration of the halogen-containing gas in the step (a1). Thus, in the substrate processing according to the embodiment, it is possible to suppress the sputtering on the in-chamber part when the first film is formed. Thus, it is possible to perform pre-coating on the inside of the chamber 12 while the generation of particles is suppressed.

In the substrate processing according to the embodiment, in the step (a1), the potential difference between the in-chamber part and the first plasma is equal to or smaller than 100 V. Thus, in the substrate processing according to the embodiment, it is possible to form the first film while the sputtering of the in-chamber part is suppressed, and to suppress the generation of particles.

In the substrate processing according to the embodiment, in the step (a1), the potential difference between the in-chamber part and the first plasma is equal to or smaller than 50 V. Thus, in the substrate processing according to the embodiment, it is possible to form the first film with more suppressing the sputtering of the in-chamber part, and to more suppress the generation of particles.

In the substrate processing according to the embodiment, the step (a1) is performed under a condition that the radio-frequency power for plasma generation is stepwise increased. Thus, in the substrate processing according to the embodiment, it is possible to quickly form the first film while the generation of particles is suppressed, and to quickly perform pre-coating on the inside of the chamber 12 in the step (a1).

In the substrate processing according to the embodiment, the step (a1) is performed until the first film has a thickness enabling protection of the in-chamber part from the second plasma. Thus, in the substrate processing according to the embodiment, it is possible to suppress the generation of particles when the second film is formed in the step (a2).

Hitherto, the embodiment has been described above. The embodiment disclosed herein is illustrative and should not be construed as limiting in all aspects. The embodiment described above may be embodied in various forms. The embodiment described above may be omitted, replaced, or modified in various forms without departing from the scope and spirit of the claims.

For example, in the above embodiment, a case where plasma etching is used as the substrate processing, and pre-coating is performed in the chamber 12 before the plasma etching has been described as an example. However, the present disclosure is not limited thereto. The substrate processing may be any type of substrate processing as long as pre-coating is performed in the substrate processing.

Further, in the above embodiment, a case where the pre-coating step of Step S2 is performed for each substrate W has been described as an example. However, the present disclosure is not limited thereto. The pre-coating step of Step S2 may be performed in accordance with a predetermined substrate processing time, a predetermined number of substrates to be processed, or a predetermined number of processing lots of substrates.

Among the steps of forming the pre-coat film according to the embodiment, the step (a1) (Step S12) of forming the first film by using the first plasma may further include a step of acquiring information regarding the light emission state of the first plasma by using a detector, and a step of estimating the film thickness of the first film deposited on the part in the chamber 12 from the acquired information. For example, a detector such as an optical sensor that detects a light emission state such as a color or light emission intensity of plasma is provided in the chamber 12, and the emission spectrum of each wavelength is measured based on information regarding the light emission state of the plasma detected by the detector. The emission spectrum of each wavelength to be measured changes depending on the film formation rate. The film formation rate may be estimated from the emission spectrum of each wavelength to estimate the film thickness of the first film deposited on the part in the chamber 12, and to estimate the degree of the film thickness of the first film deposited on the part in the chamber 12. When the estimated film thickness of the first film becomes a given thickness as a thickness enabling protection of the in-chamber part from the second plasma, the step of forming the second film may be performed.

Further, the step (a1) (Step S12) of forming the first film by using the first plasma may further include a step of obtaining information regarding the film formation characteristics from the acquired information and adjusting the film formation condition. For example, the correlation with the film formation characteristics such as the film formation rate is obtained in advance for each light emission state of plasma, and correlation information is stored in the storage of the controller 80. The film formation characteristics such as the film formation rate may be obtained from the light emission state of plasma detected by the detector, based on the correlation information stored in the storage, and the film formation condition may be adjusted to obtain the optimal film formation characteristics.

Similarly, the step (a2) (Step S13) of forming the second film by using the second plasma may also further include a step of acquiring information regarding the light emission state of the second plasma by using a detector, and a step of calculating the film formation rate from the acquired information and estimating the film thickness of the second film deposited on the in-chamber part. Further, the step (a2) (Step S13) of forming the second film by using the second plasma may further include a step of obtaining information regarding the film formation characteristics from the acquired information and adjusting the film formation condition.

The light emission state of the plasma in the chamber 12 changes depending on the state of the pre-coated film. For example, when the number of pre-coated films decreases due to the processing of the substrate, the light emission state of the plasma changes. Therefore, the pre-coating step of Step S2 may be performed based on the plasma emission state in Step S4. For example, a detector that detects the light emission state such as a color or light emission intensity of plasma may be provided in the chamber 12. When the light emission state detected by the detector is a light emission state where the number of pre-coated films decreases, the pre-coating step of Step S2 may be performed.

In the above embodiment, a case where a semiconductor wafer is used as the substrate has been described as an example, but the present disclosure is not limited thereto. The substrate may be any substrate.

According to the present disclosure, the inside of the chamber can be pre-coated while the generation of particles is suppressed.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing method comprising:
   (a) forming a pre-coat film formed by either a silicon-containing film or an organic film on an in-chamber part disposed in a chamber; and
   (b) after (a) is performed, processing one or more substrates,
   wherein (a) includes
   (a1) forming a first film on the in-chamber part without using plasma or by using a first plasma generated from a reaction gas under a condition that sputtering is suppressed on the in-chamber part, and
   (a2) forming a second film on a surface of the first film by using a second plasma,
   wherein the reaction gas includes a first reaction gas component and a second reaction gas component, and
   (a1) includes
   supplying the first reaction gas component into the chamber and causing the first reaction gas component to be adsorbed to the in-chamber part, and
   forming the first film by supplying the second reaction gas component into the chamber and causing the first reaction gas component adsorbed to the in-chamber part to react with the first plasma generated from the second reaction gas component.

2. A substrate processing method comprising:
   (a) forming a pre-coat film on an in-chamber part disposed in a chamber; and
   (b) after (a) is performed, processing one or more substrates,
   wherein (a) includes
   (a1) forming a first film on the in-chamber part without using plasma or by using a first plasma generated from a reaction gas under a condition that sputtering is suppressed on the in-chamber part, and
   (a2) forming a second film on a surface of the first film by using a second plasma,
   wherein the reaction gas includes a first reaction gas component and a second reaction gas component, and
   (a1) includes
   supplying the first reaction gas component into the chamber and causing the first reaction gas component to be adsorbed to the in-chamber part, and
   forming the first film by supplying the second reaction gas component into the chamber and causing the first reaction gas component adsorbed to the in-chamber part to react with the first plasma generated from the second reaction gas component.

3. The substrate processing method according to claim 2, wherein
   the forming in (a1) includes forming the first film on the in-chamber part by using the first plasma generated from the reaction gas.

4. The substrate processing method according to claim 3, wherein
   in (a1), a potential difference between the in-chamber part and the first plasma is equal to or smaller than 100 V.

5. The substrate processing method according to claim 3, wherein
   in (a1), a potential difference between the in-chamber part and the first plasma is equal to or smaller than 50 V.

6. The substrate processing method according to claim 3, wherein
   the forming in (a1) includes stepwise increasing a radio-frequency power from a first non-zero level to a higher level during generation of the first plasma.

7. The substrate processing method according to claim 3, wherein
   (a1) further includes
   acquiring, with a detector, emission spectrum information regarding a light emission state of the first plasma, and
   estimating a film thickness of the first film deposited on the in-chamber part from the emission spectrum information.

8. The substrate processing method according to claim 7, wherein
   (a1) further includes adjusting a film formation condition based on the emission spectrum information.

9. The substrate processing method according to claim 2, wherein
the forming in (a1) is performed until the first film has a thickness that protects the in-chamber part from the second plasma.

10. The substrate processing method according to claim 2, wherein
the first film and the second film have a common composition.

11. The substrate processing method according to claim 2, wherein
the forming in (a) is performed in accordance with a predetermined processing time of the substrate, a number of the substrates to be processed, or a number of processing lots of the substrates.

12. The substrate processing method according to claim 2, wherein
the forming of (a2) further includes
acquiring, with a detector, emission spectrum information regarding a light emission state of the second plasma, and
estimating a film thickness of the second film deposited on the in-chamber part from the emission spectrum information.

13. The substrate processing method according to claim 12, wherein
(a2) further includes adjusting a film formation condition based on the emission spectrum information.

14. A substrate processing method comprising:
(a) forming a pre-coat film by using a reaction gas containing a metal-containing gas and an oxygen-containing gas on an in-chamber part disposed in a chamber; and
(b) after (a) is performed, processing one or more substrates,
wherein (a) includes
(a1) forming a first film on the in-chamber part without using plasma or by using a first plasma under a condition that sputtering is suppressed on the in-chamber part, and
(a2) forming a second film on a surface of the first film by using a second plasma,
wherein the reaction gas includes a first reaction gas component and a second reaction gas component, and
(a1) includes
supplying the first reaction gas component into the chamber and causing the first reaction gas component to be adsorbed to the in-chamber part, and
forming the first film by supplying the second reaction gas component into the chamber and causing the first reaction gas component adsorbed to the in-chamber part to react with the first plasma generated from the second reaction gas component.

* * * * *